United States Patent [19]

Das Gupta et al.

[11] 4,063,078

[45] Dec. 13, 1977

[54] CLOCK GENERATION NETWORK FOR LEVEL SENSITIVE LOGIC SYSTEM

[75] Inventors: Sumit Das Gupta, Syracuse; Edward Baxter Eichelberger, Purdy Station, both of N.Y.

[73] Assignee: International Business Machines Corporation, Armonk, N.Y.

[21] Appl. No.: 701,376

[22] Filed: June 30, 1976

[51] Int. Cl.² .............................................. G06F 1/04
[52] U.S. Cl. ...................................... 364/700; 328/62; 364/200
[58] Field of Search .............. 235/152, 156; 307/203; 340/172.5; 328/62, 63

[56] References Cited
U.S. PATENT DOCUMENTS

| | | | |
|---|---|---|---|
| 3,764,992 | 10/1973 | Milne | 340/172.5 |
| 3,787,817 | 1/1974 | Goldberg | 340/172.5 |
| 3,983,538 | 9/1976 | Jones | 340/172.5 |

OTHER PUBLICATIONS

J. E. Elliott et al. "Array Logic Processing" *IBM Tech. Disclosure Bulletin* vol. 16 No. 2 July 1973 pp. 586–587.

*Primary Examiner*—David H. Malzahn
*Attorney, Agent, or Firm*—Wesley Debruin

[57] ABSTRACT

Disclosed is an improved clock generation network. The improved clock generation network is particularly adapted to, and has particular utility when employed in a Level Sensitive Logic System generally of the type disclosed in U.S. Pat. No. 3,783,254, of common assignee.

The disclosed clock generation network also has particular utility in a Level Sensitive Embedded Array Logic System of the type disclosed in U.S. patent application Ser. No. 701,052, filed June 30, 1976, by Messrs. E. B. Eichelberger, E. I. Muehldorf, R. G. Walther and T. W. Williams and of common assignee.

21 Claims, 5 Drawing Figures

(FIG'S 1 AND 2 CORRESPOND TO FIG'S 7 AND 8 OF U.S. PATENT NO. 3,783,254)

CLOCK GENERATION NETWORK FOR LEVEL SENSITIVE LOGIC SYSTEM

BACKGROUND OF THE INVENTION

The Level Sensitive Scan Design (LSSD), as fully disclosed in U.S. Pat. No. 3,783,254 and patent application Ser. No. 701,052, require that the sequential logic network be controlled by two or more non-overlapping clock signals. Thus, in a system designed within these constraints for testability, there must exist a network that generates two or more non-overlapping clock pulses. In the past, this clock generation network has not conformed to the LSSD rules and hence, had to be physically isolated from the LSSD portion of the system. The clock generation network of the prior art suffered from lack of testability.

The clock generation network disclosed herein not only generates at least two non-overlapping clock signals but also conforms to the LSSD design rules. Consequently, it has the following advantages over other clock generation networks. Namely, (1) the network is fully testable. (2) The network can be integrated on the same chip containing the LSSD design. This saves on chip I/O and improves performance. (3) The LSSD test generation system will generate tests for the clock network as well as for the LSSD network.

(Reference is made to U.S. Pat. Nos. 3,761,697, 3,783,254 and 3,784,907, respectively granted to E. B Eichelberger and of common assignee herewith.)

FIELD OF THE INVENTION

This invention relates to clock generation networks used to control and time the flow of digital logic signals through general purpose logic systems. More specifically, it relates to systems which require two clock trains where the pulses are non-overlapping. A novel clock generation network in accordance with the invention is particularly advantageous when employed in a Level Sensitive Logic System generally of the type disclosed in U.S. Pat. No. 3,783,254.

CROSS-REFERENCE TO RELATED APPLICATIONS AND PATENTS

United States patent application Ser. No. 701,052, entitled "Level Sensitive Embedded Array Logic System", filed June 30, 1976, by Messrs. E. B. Eichelberger, E. I. Muehldorf, R. G. Walther and T. W. Williams, and of common assignee.

United States patent application Ser. No. 701,054, entitled "Method of Level Sensitive Testing A Functional Logic System With Embedded Array", filed June, 30, 1976, by Messrs. E. B. Eichelberger, E. I. Muehldorf, R. G. Walther and T. W. Williams, and of common assignee.

United States patent application Ser. No. 701,053, entitled "Reduced Overhead for Gated B Clock Testing", filed June 30, 1976, by Messrs. E. B. Eichelberger and T. W. Williams and of common assignee.

Unites States patent application Ser. No. 589,231, entitled, "High Density Semiconductor Chip Organization", by E. B Eichelberger and G. J. Robbins, filed June 23, 1975, granted as U.S. Pat. No. 4,006,492 on Feb. 1, 1977, and of common assignee.

United States patent application Ser. No. 701,055, entitled "Implementation of Level Sensitive Logic System Accordion Register Means" by Hua-Tung Lee, filed June 30, 1976 and of common assignee.

United States patent application Ser. No. 701,041, entitled "Method of Propagation Delay Testing A Level Sensitive Embedded Array Logic System" by E. B. Eichelberger, E. I. Muehldorf, R. G. Walther and T. W. Williams, filed June 30, 1976 and of common assignee.

United States patent application Ser. No. 534,606, filed Dec. 20, 1974, entitled "Testing Embedded Array", by E. B. Eichelberger, granted as U.S. Pat. No. 3,961,252 on June, 1, 1976 and of common assignee.

United States patent application Ser. No. 534,608, entitled "Testing Embedded Arrays", by J. R. Cavaliere and R. Robortaccio, filed Dec. 20, 1974, granted as U.S. Pat. No. 3,961,254 on June 1, 1976 and of common assignee.

United States patent application Ser. No. 534,605, entitled "Testing Embedded Arrays" filed Dec. 20, 1974, by W. P. Hurley and H. P. Muhlfeld, granted as U.S. Pat. No. 3,961,251 on June 1, 1976 and of common assignee.

United States Pat. No. 3,783,254, entitled "Level Sensitive Logic System", application Ser. No. 297,543, filed Oct. 16, 1972 granted Jan. 1, 1974 to Edward B. Eichelberger and of common assignee with this application.

U.S. Pat. No. 3,761,695, entitled, "Method of Level Sensitive Testing a Functional Logic System ", application Ser. No. 298,087, filed Oct. 16, 1972, granted Sept. 25, 1973 to Edward B. Eichelberger and of common assignee with this application.

U.S. Pat. No. 3,784,907, entitled "Method of Propagation Delay Testing a Functional Logic System", application Ser. No. 298,071, filed Oct. 16, 1972, granted Jan. 8, 1974 to Edward B. Eichelberger and of common assignee with this application.

DESCRIPTION OF THE PRIOR ART

In the past, the designer of computer logic has had complete flexibility in arranging logic circuitry to implement system and sub-system logic functions in central processing units, channels and control units employed in digital computing apparatus. A significant variety of design implementations has resulted from the exercise of this flexibility. Each of these implementations has its own special dependency on the AC characteristics of the individual circuits employed in the system.

The independence and flexibility characterizing the arrangements of the designer often led to unexpected system timing problems, complicated and complex problems in testing the circuitry, and a significant complexity and detail required for educating the field service personnel for such computing systems. However, it had the advantage of permitting the designer to use all techniques to obtain the best performance by employing the fewest number of circuits. The interface between the logic designer and the component manufacturer was reasonably well defined and the approach of the past could be supported in component manufacturing since the AC parameters such as rise time, fall time, individual circuit delay, etc., could rather readily be tested.

With the advent of larger scale integration, however, this well defined and reliably tested interface no longer exists. It has become impossible or impractical to test each circuit for all of the well known AC circuit parameters. As a result, it is necessary to partition and divide logic systems and sub-systems into functional units having characteristics that are substantially insensitive to these parameters.

One method of obtaining this structure in digital systems is to organize them in the manner described in U.S. Pat. No. 3,783,254, entitled "Level Sensitive Logic System" granted Jan. 1, 1974 to Edward B. Eichelberger on application Ser. No. 297,543 filed Oct. 16, 1972 and of common assignee herewith. When this is done, the resulting digital system will have the general form shown in FIG. 1. The disclosure of U.S. Pat. No. 3,783,254 is incorporated herein by reference thereto to the same extent as though it was expressly set forth herein word for word.

This logic system operates in a synchronous manner under control of two non-overlapping clock trains, C1 and C2. When the C1 clock pulse occurs, data signals from the combinational network 1 are clocked into the latches in Shift Rgister Latch Set 3, and propagate through the combinational networks 4, 9. When these signals have finished propagating, the C2 clock pulse occurs and the data signals from 4 are clocked into the latches in Shift Register Latch Set 6. These latch signals, in turn, propagate through the combinational networks 1, 9. When these signals have finished propagating, the cycle is again initiated with the C1 clock pulse.

The Shift Register Latch Sets consist of one or more "Shift Register Latches" shown in FIG. 2. These are interconnected into a shift register controlled by the A and B shift clocks by connecting the V output of one cell to the U input of the next cell. Each Shift Register Latch contains two clocked latches, L1 and L2. The first latch is controlled by two clock inputs, C and A. When the C clock input is pulsed, the value of the input signal E, is stored in the L1 latch. When the A clock input is pulsed, the value of the input signal U is stored in the L1 latch. The second latch L2 is controlled by the B clock such that when it is pulsed, the value of the L1 latch is stored in the L2 latch. The signals on output L and V correspond to the data stored in latches L1 and L2, respectively.

Logic system with the structure shown in FIG. 1 have many advantages over other logic systems. One of these advantages is the ability to fully test the structure in race-free manner by controlling the clock inputs C1, C2, A, B and by using the shift registers to apply and measure test patterns.

Since this type of fully testable logic structure requires, as inputs, two synchronous trains of non-overlapping clock signals, C1 and C2, the logic system must also contain a network that generates these clock pulses. This invention is directed to a general logic structure that performs this function, will itself be fully testable, and can be made to be part of the logic system without changing the structure described in FIG. 1.

It is a primary object of this invention to provide an improved clock generation network for Level Sensitive Logic Systems.

It is a primary object of this invention to provide a clock generation network that is in full accord with Level Sensitive Scan Design (LSSD) rules.

It is a primary object of this invention to provide a clock generation network that is fully testable by LSSD test generation methods and techniques.

It is an object of this invention to provide a Level Sensitive Logic System with or without an embedded array, and employing a clock generation network in accordance with the invention.

It is an object of the invention to provide an improved Level Sensitive Logic System means employing at least one clock generation network means, in accordance with the invention, and all arranged and interconnected to facilitate testing irrespective of the level of the package, such a chip, module, card, board and system.

SUMMARY OF THE INVENTION

The synchronous timing of most digital systems is accomplished by deriving a number of different pulse trains from a single oscillator signal. Normally, this oscillator is crystal controlled for accuracy and is a square wave binary signal. This invention describes a logic network that will generate two non-overlapping clock trains from a single oscillator signal.

The time separation between the "turning-off" of one clock and the "turning-on" of the other clock is accomplished by delaying the oscillator signal with the use of one or more logic inverters.

Normally, when two such clock trains are generated in this manner, the resulting logic network is redundant and cannot be fully tested with slow speed digital test equipment. In addition, the oscillator input will control both clock trains and cannot be integrated into the digital system without violating the structure shown in FIG. 1.

These two problems are solved in this invention by two techniques. The first technique is to bring the oscillator signal into the network on two separate input pins. (When fully assembled as a system, these two inputs are connected together and are fed by the oscillator). This prevents the resulting network from being redundant. The second technique is to add two extra inputs called "pseudo clock inputs". These pseudo clock inputs gate the two clock trains derived from the oscillator signal and can be used as the clock inputs for the entire network during testing. This will allow both clocks to be held off together and will allow them to be independently controlled. If this network is integrated into a logic system of the type shown in FIG. 1, it will not change the structure of the network. The oscillator inputs will be one of the inputs designated S and the pseudo clock inputs will correspond to the clock inputs, C1 and C2. This will allow all circuits in the clock generation network to be tested in the same manner as the other circuits in the logic system.

DESCRIPTION OF THE PREFERRED EMBODIMENT

Figure 3:
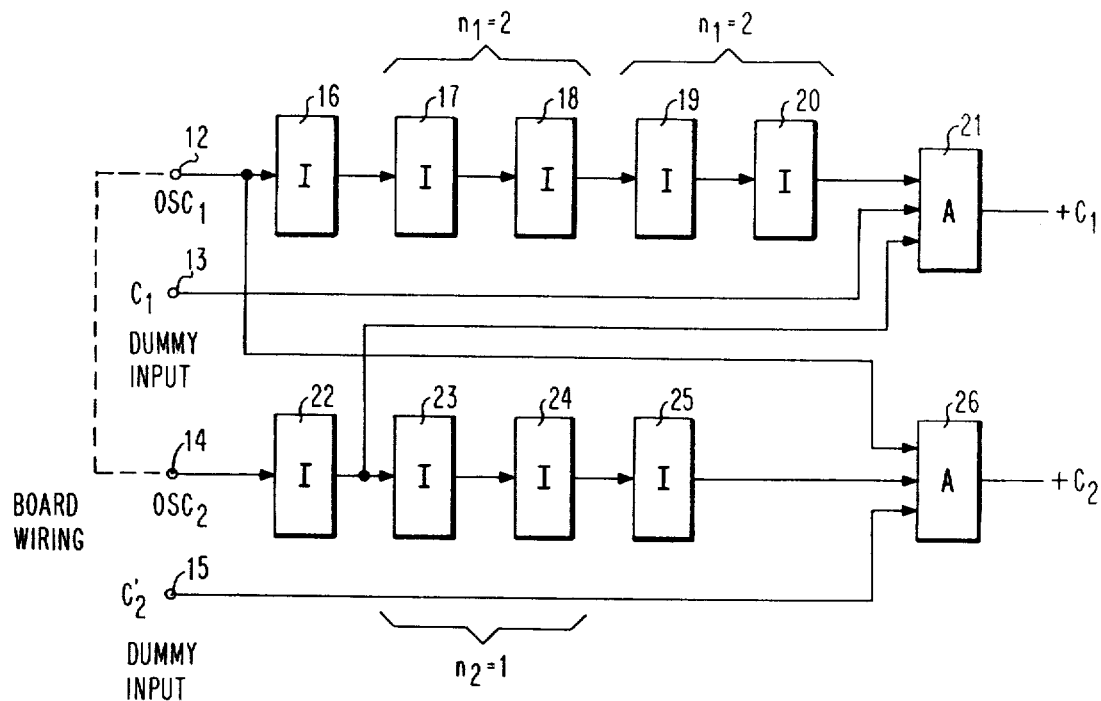
FIG. 3 is a logic diagram of the clock generation network in accordance with the invention for $n1 = 2$ and $n2 = 1$.

The general logic structure for generating two non-overlapping clock trains from an oscillator signal is shown in FIG. 3. The structure involves two strings of inverters fed from two different inputs, OSC1 and OSC2. The two strings of inverters are used to delay the oscillator signal and thus produce the time separation between the two output clock trains. The two "Dummy Inputs" 13, 15 are used for test purposes and are normally held at a logical 1 during normal operation and do not effect the operation of the clock generation network.

The network in FIG. 3 operates in the following way. When the oscillator inputs (OSC1 and OSC2) are positive, both inputs to the AND gate 26 are positive and +C2 is positive. Both inputs to AND gate 21 are negative and +C1 is negative. When the oscillator signal goes negative, the OSC1 input to gate 26 goes negative causing its output, (+C2) to go negative. The oscillator signal must then propagate through gates 16, 17, 18, 19, 20 and 21 before +C1 goes positive. When the oscillator signal goes positive, it first propagates through gate 22 causing the input to gate 21 to go negative and thus, make C1 go negative. The signal then propagates through gates 23, 24, 25 and 26 before +C2 goes positive.

The time separation between +C2 going negative and +C1 going positive is determined by the propagation delay of gates 16, 17, 18, 19 and 20. Similarly, the time separation between +C1 going negative and +C2 going positive is determined by the delay of gates 23, 24 and 25.

The time separation between clock signals can be varied by changing the number of gates in the inverter chains. In FIG. 3, there are four extra inverters (17, 18, 19 and 20) for this delay between +C2 going negative and +C1 going positive. There are two extra inverters (23, 24) for this delay between +C1 going negative and +C2 going positive.

If the extra pairs of inverters between OSC1 and +C1 is designated as $n1$, then the time delay separation between +C2 going negative and +C1 going positive is given by the following equation:

$$D(2-1) = (1 + 2n1) do$$

where
$D(2-1)$ = Delay between C2 going negative and C1 going positive
$do$ = time delay of one inverter gate
$n1$ = extra pairs of inverters
Similarly $$D(1-2) = (1 + 2n2) do$$

The network in FIG. 3 is for delay separation for $n1 = 2$ and $n2 = 1$.

Figure 4:
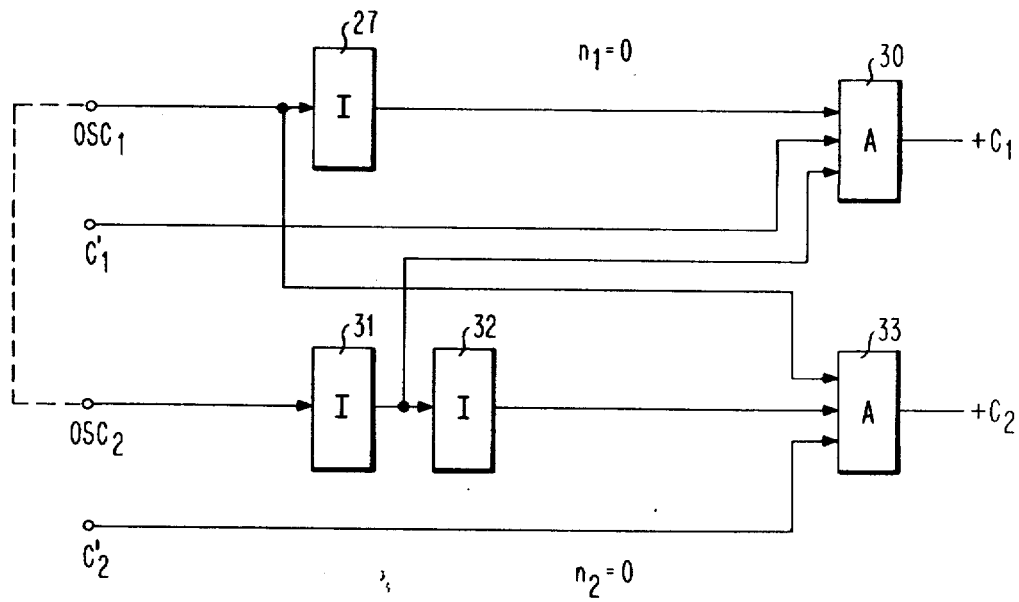
FIG. 4 is a logic diagram of the clock generation network in accordance with the invention for $n1 = 0$ and $n2 = 0$.
Figure 5:
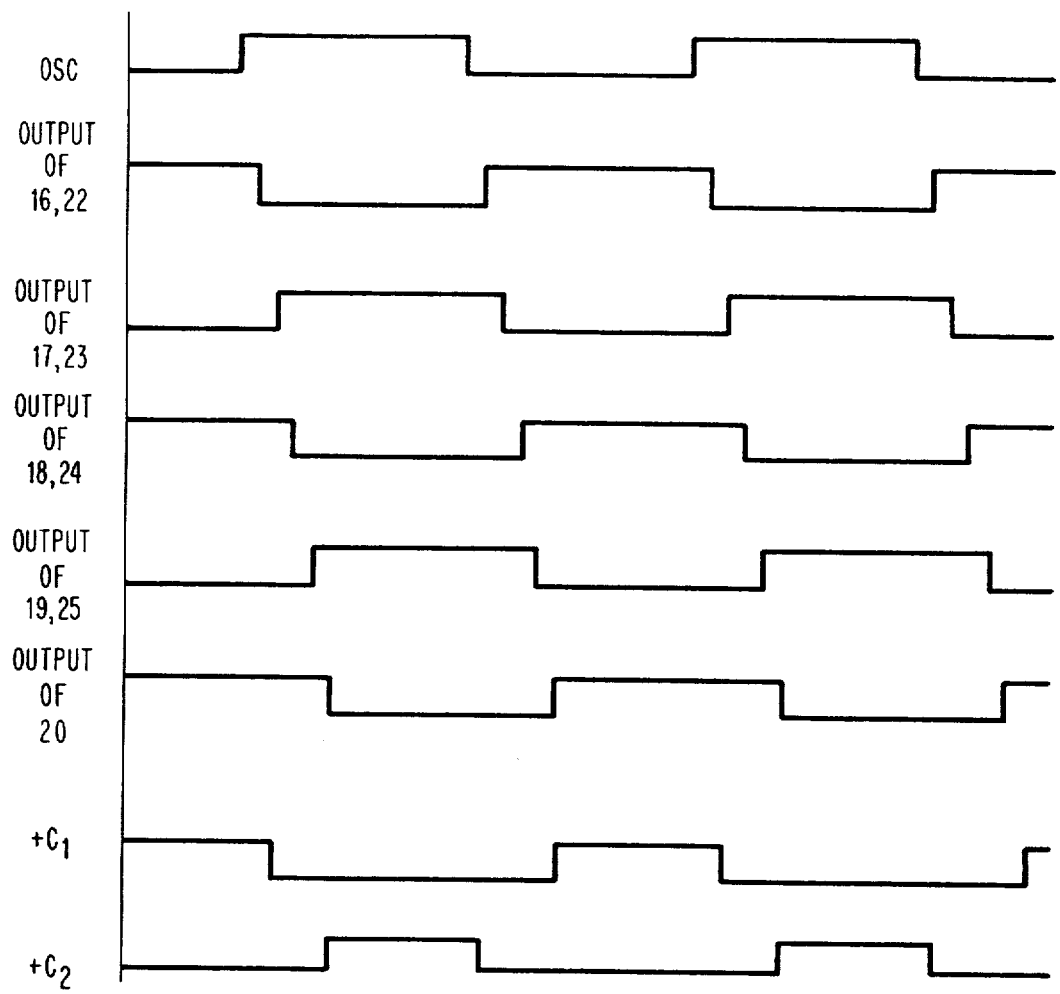
FIG. 5 is a timing diagram of all the signals in the clock generation network depicted in FIG. 3.

The network in FIG. 4 is the least complicated version of the clock generation network and is for $n1 = 0$ and $n2 = 0$.

Clearly, an entire family of networks of this type could be constructed for corresponding integer values for $n1$ and $n2$.

Under normal operation in a digital system, the inputs, OSC1 and OSC2 are electrically connected together and are driven by the same signal coming from the oscillator. By using two inputs, the resulting network becomes fully testable.

Figure 1:
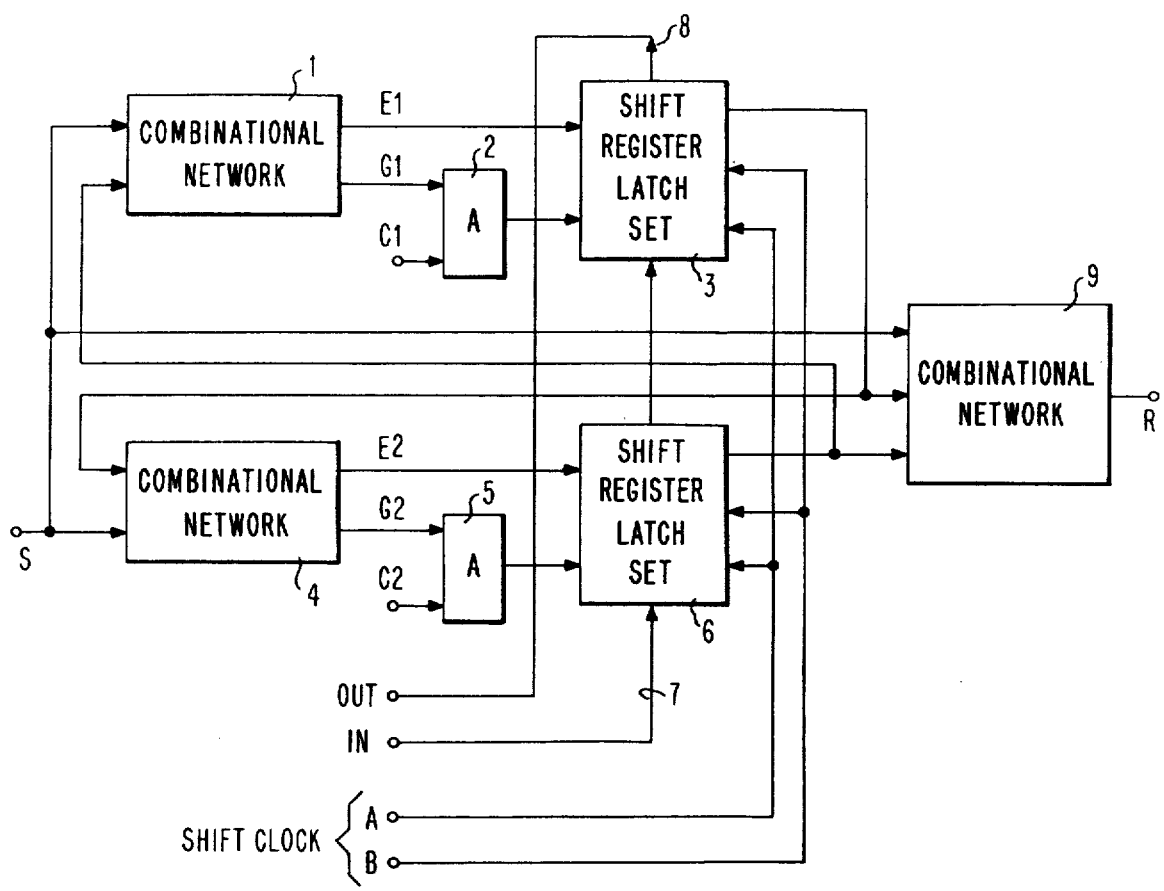
FIG. 1 is a schematic diagram of the organization of a generalized logic system having provision for accomplishing scan-in/scan-out of the system.
Figure 2:
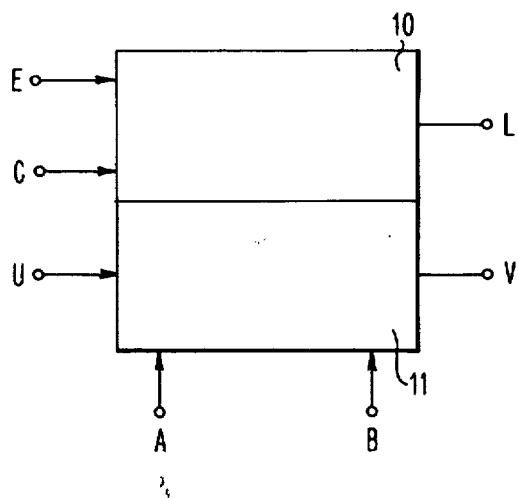
FIG. 2 is a symbolic representation of a latch configuration to be employed in the generalized structure of FIG. 1.

The extra dummy clock inputs, C1' and C2' allow this clock generation network to be integrated into a general digital system having the general structure shown in FIG. 1. When this is done, the pseudo clock inputs C1' and C2' now become the system clock inputs identified as C1 and C2 in FIG. 1. The +OSC and −OSC inputs become some of the inputs designated by S in FIG. 1. In this way, the clock generation network becomes part of a fully testable logic system instead of a physically separate logic network.

It is also to be appreciated by persons skilled in the art that in accordance with the invention, numerous modifications may be made in the illustrative preferred embodiment. Merely, by way of example, any one or more of the AND circuits 21, 26, 30 and 33 (FIGS. 3 and 4) may be implemented as an AND-INVERT circuit.

While this invention has been particularly described with reference to the preferred embodiments thereof, it will be understood by those skilled in the art that the foregoing and other changes in form and detail may be made therein without departing from the spirit and scope of the invention.

What is claimed is:

1. A semiconductor chip containing integrated circuitry for use in a digital computer of the like, comprising:
   a plurality of networks at least one of which is a combinational logic network, at least one of said networks being responsive to a set of input signals with each network providing at least a first set of signals;
   a clock generation system for generating a plurality of clock signal trains wherein the signals of each of said plurality of clock signal trains is non-overlapping in time duration with the signals of each other ones of said plurality of clock signal trains;
   plural sequential circuit means arranged in groups coupled to respective ones of said plurality of networks for receiving respective first sets of signals from said network under control of predetermined ones of said non-overlapping clock signal trains to store indications of the signals from its associated network and to provide a set of outputs for said indications;
   means coupling said output indications from the respective groups of plural sequential circuit means as sets of inputs to all networks except a network coupled to a sequential circuit means controlled by the clock signal train exercising control in providing the set of output indications.
   means for accepting the sets of output indications to provide an output response from said chip;
   said integrated circuitry on said semiconductor chip being further characterized in that said clock generation system wholly contained on and within said semiconductor chip comprises:
   a chip input terminal for receiving a periodic input;
   a plurality of interconnected logical circuit means connected to said input terminal; each of said plurality of logical circuit means providing a discrete one of said plurality of non-overlapping clock signal trains.

2. In a semiconductor chip as recited in claim 1 wherein said clock generation system is further characterized by the inclusion of test circuit means having at least one chip input terminal for use in testing said plurality of interconnected logical circuit means and the time occurrence of said clock signals of each of said non-overlapping clock signal trains.

3. In a semiconductor chip as recited in claim 2 wherein the combination of said plurality of interconnected logical circuit means and said test circuit means comprises Inverter circuit means and AND circuit means.

4. A semiconductor chip as recited in claim 3, wherein the number of groups of sequential circuit means is equivalent to the number of clock signal trains and each group is controlled by a different one of said trains.

5. A semiconductor chip as recited in claim 4 wherein said trains are non-overlapping and a predetermined duration exists between the occurrence of signals in successive trains, said duration being greater than the longest propagation time through said networks.

6. A semiconductor chip as recited in claim 5 wherein the combination logic network further provides a second set of combinational signals and means are provided with each group of sequential circuit means coupled to said combinational network to render the groups responsive only to the presence of respective second sets of signals and the clock signal train for that group, whereby the first sets of signals from the networks are stored in respective groups.

7. A semiconductor chip as recited in claim 6, wherein each of the plural sequential circuit means includes means for providing access to them independent of the clock signal train control and the access means of each of said sequential circuit means are coupled together for providing scan in/scan out of said integrated circuitry of said semiconductor chip.

8. A semiconductor chip, as recited in claim 7 wherein each of the sequential circuit means comprises first and second bistable storage circuits with the first of said circuits coupled to a respective one of said networks and to a clock signal train and operative to provide one of said set of outputs and said second bistable circuit is coupled to the output of the associated first bistable network, and said access means comprises input means coupled to said first circuit, output means coupled to said second circuit and means for controlling the entry of data into the first circuit and exit of said data from the second circuit independent of the clock signal train control.

9. A semiconductor chip, as recited in claim 8, wherein the entry and exit control means are coupled to all of said sequential circuit means and said sequential circuit means coupled together in cascade with output of each said second bistable circuit except the last coupled as an input to the next succeeding first bistable circuit, the first bistable circuit receiving an independent data input and the last second bistable circuit providing an independent data output, whereby said plural sequential circuit means are coupled together as a register for accomplishing said scan in/scan out of said integrated circuitry of said semiconductor chip.

10. A functional logic unit for performing at least one predetermined logical function wherein the circuitry is organized and arranged to facilitate testing said unit, said unit comprising:
a plurality of networks at least one of which is a combinational logic network, at least one of said networks being responsive to a set of input signals with each network providing at least a first set of signals;
a clock generation system for generating a plurality of clock signal trains wherein the signals of each of said plurality of clock signal trains is non-overlapping in time duration with the signals of each other ones of said plurality of clock signal trains;

plural sequential circuit means arranged in groups coupled to respective ones of said plurality of networks for receiving respective first sets of signals from said network under control of predetermined ones of said non-overlapping clock signal trains to store indications of the signals from its associated network and to provide a set of outputs for said indications;
means coupling said output indications from the respective groups of plural sequential circuit means as sets of inputs to all networks except a network coupled to a sequential circuit means controlled by the clock signal train exercising control in providing the set of output indications;
means for accepting the sets of output indications to provide an output response from said unit;
said functional unit being further characterized in that said clock generation system includes:
at least one unit input terminal for receiving a periodic input;
at least first and second interconnected logical circuit means connected to said input terminal;
each of said logical circuit means providing a discrete one of said plurality of non-overlapping clock signal trains, each of said plurality of logical circuit means being level sensitive and single sided delay dependent.

11. A functional unit as recited in claim 10 wherein said clock generation system is further characterized by the inclusion of test circuit means having at least one input terminal for use in testing said interconnected logical circuit means and the time occurrence of said clock signals of each of said non-overlapping clock signal trains and wherein in combination said interconnected logical circuit means and said test circuit means comprises Inverter Circuit means and AND circuit means.

12. A functional unit as recited in claim 10 where said first interconnected logical circuit means includes a first AND circuit having at least first and second inputs and an output, a first integer number of inverter circuits serially connected between said unit input terminal and said first input of said first AND circuit, an additional inverter circuit, having an input and an output and connecting said second input of said first AND circuit to said unit input terminal, and said second interconnected logical circuit means includes a second AND circuit having at least first and second inputs and an output, connection means directly connecting said first input of said second AND circuit to said unit input terminal, and a second integer number of inverter circuits serially connected between said second input terminal of said second AND circuit and said output of said additional inverter circuit.

13. A functional unit as recited in claim 12, wherein said additional inverter circuit, each of said first integer number of inverter circuits and each of said second integer number of inverter circuits have equal time delay characteristics.

14. A functional unit as recited in claim 13 wherein said first integer number is equal to or greater than said second integer number.

15. A functional unit, as recited in claim 14, wherein said first AND circuit and said second AND circuit each have a third input utilized for test purposes.

16. A clock generation network for providing first and second pulse trains, where each said pulse in said first pulse train is precisely time displaced from each said corresponding pulse in said second pulse train, said clock generation network comprising:
- an input terminal for receiving a periodic input;
- first and second interconnected logical circuit means connected to said input terminal;
- said first logical circuit means comprised of inverter circuit means and AND circuit means having an output for electrically manifesting said first pulse train;
- said second logical circuit means comprised of inverter circuit means and AND circuit means having an output for electrically manifesting said second pulse train.

17. A clock generation network as recited in claim 16 wherein said AND circuit means of said first logical circuit means and said AND circuit means of said second logical circuit means respectively include an additional dummy input for use in testing said clock generation network.

18. A clock generation network as recited in claim 16 wherein, said AND circuit means of said first and second logic circuit means respectively include a first input connected to said inverter circuit means of said first logical circuit means, a second input connected to said inverter circuit means of said second logical circuit means, and a third input respectively connected to a discrete test input terminal.

19. A level sensitive logic system for use in a digital computer of the like, comprising:
- a plurality of networks at least one of which is a combinational logic network, at least one of said networks being responsive to a set of input signals with each network providing at least a first set of signals;
- a clock generation system for generating a plurality of clock signal trains wherein the signals of each of said plurality of clock signal trains is non-overlapping in time duration with the signals of each other ones of said plurality of clock signal trains;
- plural sequential circuit means arranged in groups coupled to respective ones of said plurality of networks for receiving respective first sets of signals from said network under control of predetermined ones of said non-overlapping clock signal trains to store indications of the signals from its associated network and to provide a set of outputs for said indications;
- means coupling said output indications from the respective groups of plural sequential circuit means as sets of inputs to at least certain networks except a network coupled to a sequential circuit means controlled by the clock signal train exercising control in providing the set of output indications;
- means for accepting the sets of output indications to provide an output response from said system;
- said level sensitive logic system being further characterized by said clock generation system comprising:
- a chip input terminal for receiving a periodic input;
- a plurality of interconnected logical circuit means connected to said input terminal; each of said plurality of logical circuit means providing a discrete one of said plurality of non-overlapping clock signal trains.

20. A level sensitive logic system as recited in claim 19 where in each of said plurality of interconnected logical circuit means includes a discrete test terminal.

21. A level sensitive logic system as recited in claim 20 wherein said system is contained on at least first and second interconnected integrated circuit semiconductor chips.

* * * * *